United States Patent
Manek et al.

(10) Patent No.: US 11,886,782 B2
(45) Date of Patent: Jan. 30, 2024

(54) DYNAMICS MODEL FOR GLOBALLY STABLE MODELING OF SYSTEM DYNAMICS

(71) Applicants: Robert Bosch GmbH, Stuttgart (DE); Carnegie Mellon University, Pittsburgh, PA (US)

(72) Inventors: Gaurav Manek, Pittsburgh, PA (US); Jeremy Zieg Kolter, Pittsburgh, PA (US); Julia Vinogradska, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 836 days.

(21) Appl. No.: 16/933,245

(22) Filed: Jul. 20, 2020

(65) Prior Publication Data
US 2021/0042457 A1   Feb. 11, 2021

(30) Foreign Application Priority Data
Aug. 5, 2019   (EP) ................................. 19190105

(51) Int. Cl.
*G06F 30/27*   (2020.01)
*G06N 20/00*   (2019.01)
(Continued)

(52) U.S. Cl.
CPC ........... *G06F 30/27* (2020.01); *G05B 13/027* (2013.01); *G05B 13/048* (2013.01); *G06N 3/08* (2013.01); *G06N 5/046* (2013.01); *G06N 20/00* (2019.01)

(58) Field of Classification Search
CPC ..... G06F 30/27; G05B 13/027; G05B 13/048; G05B 13/042; G05B 13/0265; G06N 3/08;
(Continued)

(56) References Cited

U.S. PATENT DOCUMENTS 11,049,010 B2 *   6/2021   Dani ................... G06F 18/2413

OTHER PUBLICATIONS

Plakias Spyridon and Yiannis S. Boutalis, "Adaptive One-Step Model Predictive Control using Lyapunov Theory-Based Deep Neural Networks," 2018 26th Mediterranean Conference on Control and Automation (MED) Zadar, Croatia, Jun. 19-22, 2018 (Year: 2018).*

(Continued)

*Primary Examiner* — Steven W Crabb
(74) *Attorney, Agent, or Firm* — NORTON ROSE FULBRIGHT US LLP

(57) ABSTRACT

A system and computer-implemented method are provided for training a dynamics model to learn the dynamics of a physical system. The dynamics model may be learned to be able to infer a future state of the physical system and/or its environment based on a current state of the physical system and/or its environment. The learned dynamics model is inherently globally stable. Instead of learning a dynamics model and attempting to separately verify its stability, the learnable dynamics model comprises a learnable Lyapunov function which is jointly learned together with the nominal dynamics of the physical system. The learned dynamics model is highly suitable for real-life applications in which a physical system may assume a state which was unseen during training as the learned dynamics model is inherently globally stable.

13 Claims, 9 Drawing Sheets

(51) Int. Cl.
- *G05B 13/02* (2006.01)
- *G05B 13/04* (2006.01)
- *G06N 3/08* (2023.01)
- *G06N 5/046* (2023.01)

(58) Field of Classification Search
CPC ........ G06N 5/046; G06N 20/00; G06N 3/045; G06N 3/048
See application file for complete search history.

(56) References Cited

OTHER PUBLICATIONS

Klaus Neumann et al., "Neural Learning of Stable Dynamical Systems based on Data-Driven Lyapunov Candidates," 2013 IEEE/RSJ International Conference on Intelligent Robots and Systems (IROS) Nov. 3-7, 2013 (Year: 2013).*

Amos, et al.: "Input Convex Neural Networks", arXiv:1609.07152v3 [cs.LG], (2017) pp. 1-15, XP55665528.

Dong, et al.: "The Feature Representation Ability of Variational AutoEncoder", 2018 IEEE 3rd International Conference on Data Science in Cyberspace (DSC), Jun. 18, 2018, pp. 680-684, XP033375428.

Wu, et al.: "Machine l earning-based predictive control of nonlinear processes. Part I: Theory", AlCnE Journal, 65(11), (2019). pp. 1-14; XP55665512; https://doi.org/10.1002/aic.16729.

Yinlam Chow, et al., "A Lyapunov-Based Approach to Safe Reinforcement Learning," NIPS, Cornell University, 2018, pp. 1-29. https://arxiv.org/abs/1805.07708.

Spencer M Richards, et al., "The Lyapunov Neural Network: Adaptive Stability Certification for Safe Learning of Dynamic Systems," Cornell University, 2018, pp. 1-11. https://arxiv.org/abs/1808.00924.

Andrew J Taylor, et al., "Episodic Learning With Control Lyapunov Functions for Uncertain Robotic Systems," Cornell University, 2019, pp. 1-7. https://arxiv.org/abs/1903.01577.

* cited by examiner

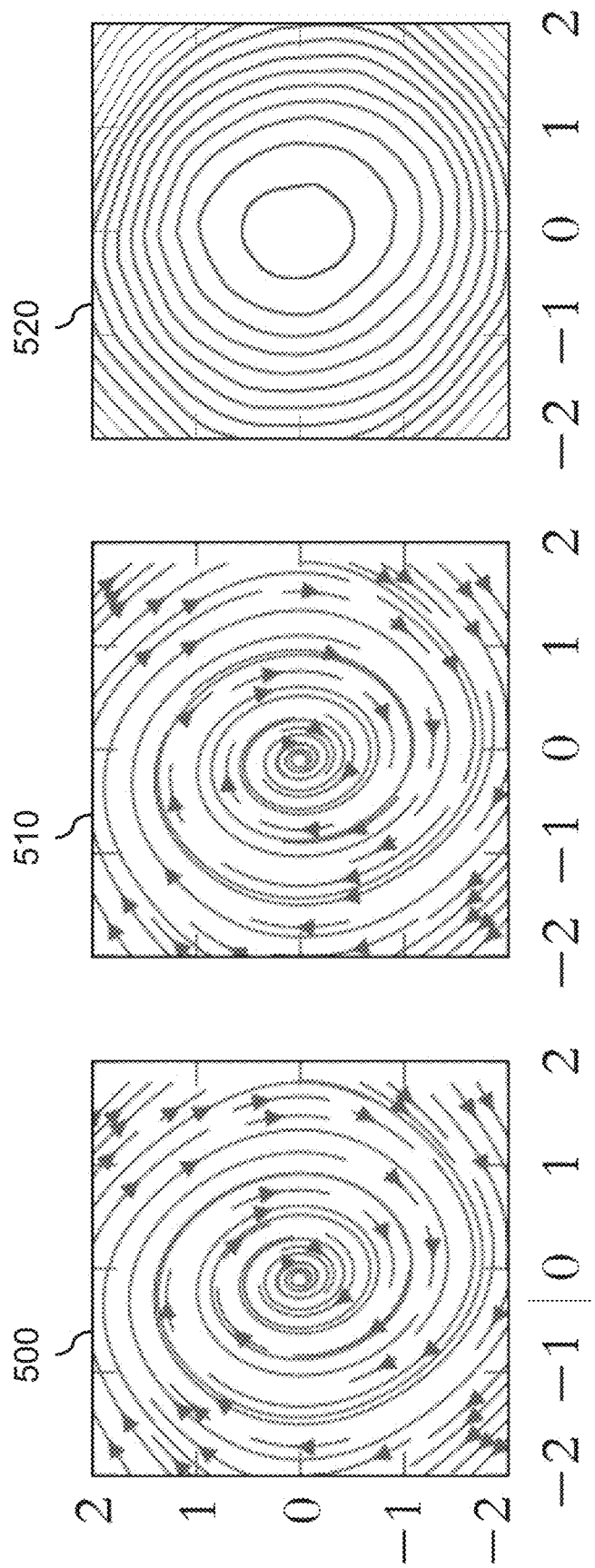

DYNAMICS MODEL FOR GLOBALLY STABLE MODELING OF SYSTEM DYNAMICS

CROSS REFERENCE

The present application claims the benefit under 35 U.S.C. § 119 of European Patent Application No. EP 19190105.7 filed on Aug. 5, 2019, which is expressly incorporated herein by reference in its entirety.

FIELD

The present invention relates to a machine learning system and computer-implemented method for training a dynamics model to learn dynamics of a physical system. The present invention further relates to a trained dynamics model. The present invention further relates to a control or monitoring system and computer-implemented method for controlling or monitoring a physical system using a machine learned modelling of dynamics of the physical system. The present invention further relates to a computer-readable medium comprising instructions for performing one of the computer-implemented methods.

BACKGROUND INFORMATION

In many real-life applications, it is desirable to learn a model of the dynamics of a physical system. This may be especially desirable when the physical system can only be observed as a highly unstructured environment, e.g., as frames from a video camera instead of physically relevant quantities as angles, angular velocities, etc. In such examples, neural networks are a promising approach to learn the transformation from observation space to the latent, physically meaningful low-dimensional space of the system dynamics of the physical system, and may also be referred to as machine learned dynamics models.

An example of such a real-life application is the manufacturing of electronic components, where two parts may need to be connected by first bonding a copper wire to one component, then bending the wire into place and, finally, bonding the copper wire to the second component. The bending of the wire may be performed by an arm of a robot. To make this procedure adaptive to the individual components, the bending process cannot be hardcoded but is preferably learned based on sensor input. Typically, sensors that measure the physically relevant low-dimensional state of the system (e.g., angles, angular velocities, joint positions . . . ) cannot be added to the production system if it is already in place, as they must be built into the machine itself. In contrast, it may be rather straightforward to add an external sensor, as, e.g., a camera system, to the manufacturing station. This video data this camera system may be used to learn the bending process of the copper wire.

Disadvantageously, it is very hard to learn the dynamics of a robotic arm from video data using a neural network, since the characteristic long-term behavior of the robotic arm, e.g., stability at certain equilibrium points, can typically not be built automatically into a neural network. The same applies to the modeling of the dynamics of other types of physical systems, including but not limited to robots, vehicles, buildings, domestic appliances, power tools, manufacturing machines, etc., from observed states of the physical system.

Namely, when using a generic neural network to model the dynamics of a physical system, little can be guaranteed about the behavior of the learned neural network. For example, it is difficult to determine the stability properties of a learned neural network. This has led to the need for enormous data sets for training such neural networks in order to ensure that the learned dynamics of the neural network have correct long-term behavior.

While some recent work [1], [2], [3], has begun to consider stability properties of neural networks, it has typically done so by "softly" enforcing stability as an additional loss term on the training data. Consequently, such approaches can say little about the stability of the learned neural network for unseen states, referring to states of the physical system which are not 'seen' during training. Disadvantageously, such approaches are not optimally suited for real-life applications in which such unseen states may occur.

REFERENCES

[1] Yinlam Chow, Ofir Nachum, Edgar Duenez-Guzman, and Mohammad Ghavamzadeh. *A lyapunov-based approach to safe reinforcement learning.* NIPS 2018, https://arxiv.org/abs/1805.07708

[2] Spencer M Richards, Felix Berkenkamp, and Andreas Krause. *The lyapunov neural network: Adaptive stability certification for safe learning of dynamic systems.* arXiv preprint, https://arxiv.org/abs/1808.00924

[3] Andrew J Taylor, Victor D Dorobantu, Hoang M Le, Yisong Yue, and Aaron D Ames. *Episodic learning with control lyapunov functions for uncertain robotic systems.* arXiv preprint, https://arxiv.org/abs/1903.01577

SUMMARY

It would be desirable to train a dynamics model to learn the dynamics of a physical system, for example the forward dynamics of a robotic arm, in a manner which ensures a globally stable modeling of the dynamics of the physical system.

In accordance with a first aspect of the present invention, a machine learning system and corresponding computer-implemented method are provided for training a dynamics model to learn dynamics of a physical system. In accordance with a further aspect of the present invention, a computer-implemented method and a corresponding control or monitoring system are provided for controlling or monitoring a physical system using a machine learned modelling of dynamics of the physical system. In accordance with a further aspect of the present invention, a computer-readable medium is provided comprising transitory or non-transitory data representing model data defining a learned dynamics model. In accordance with a further aspect of the present invention, a computer-readable medium is provided comprising data representing instructions arranged to cause a processor system to perform a computer-implemented method.

The above measures may involve training a dynamics model to learn the dynamics of the physical system. In particular, the dynamics model may be learned to be able to infer a future state of the physical system and/or its environment based on a current state of, respectively, the physical system and/or its environment. Such a state of the physical system may be expressed in various ways. For example, in the above example of a robotic arm, the state of the robotic arm may be expressed as angles, angular velocities, joint positions, etc., or in general may be represented by known physical quantities. The training data may contain direct observations of such known physical quantities. In other examples, the state of the physical system may be observed in a high-dimensional observation space, e.g., as video data, which may be transformed to a latent, physically meaningful low-dimensional space using a transformation. In this case, the states of the physical system and thereby the training data may be represented as latent samples in the obtained low-dimensional space, and may, but do not need to, correspond to known physical quantities. Conventionally, such transformation can be learned by machine learning, e.g., using Variational Auto Encoders (VAEs). In some examples, the transformation may be learned by the dynamics model itself in that the training data may comprise indirect observations of physically meaningful quantities, e.g., in a high-dimensional observation space.

It is noted that, in general, the dynamics of a physical system may in many cases also be learned from a state of the environment of the physical system, instead or in addition to learning the dynamics from the state of the physical system itself. For example, the steering dynamics of an autonomous vehicle may be learned from a video camera mounted in the autonomous vehicle which is directed towards the road ahead of the vehicle.

To train the dynamics model, training data may be accessed which defines a time-series of states x(t) of the physical system and/or its environment. Conventionally, a dynamics model can be trained to learn the dynamics of a physical system using such training data. Namely, the training data may provide time-sequential pairs of states, with each pair being formed by a current state and a future state of the physical system, with the former being an input and the latter being a target output of the dynamics model in the model's training.

The above measures may ensure global stability of the learned dynamics model $f(x(t))$ by way of a Lyapunov function $V(x(t))$. Namely, the stability of any nonlinear system can be shown via the existence of a Lyapunov function, which is a particular type of function that connects a descent in its function values along trajectories of the dynamics $f$ with the different types of stability. A dynamics system is globally stable if and only if there exists a continuously differentiable positive definite function V (i.e., $V(0)=0, V(x)>0 \forall x \neq 0$) that decreases along the trajectories of $f$, i.e., $$\dot{V}(x(t)) = \frac{d}{dt}V(x(t)) = \nabla V(x)^T \frac{d}{dt}x(t) = \nabla V(x(t))^T f(x(t)) < 0.$$

In a time-discrete variant of the above, the initial state $x_0$ and $f(x)$ may together define a state evolution $x(t), t \in [0;T]$ or $x_0, x_1, \ldots, x_T$ in discrete-time. This state evolution may represent a trajectory of $f(x)$, and decreasing along all trajectories of $f$ may mean that for any $x_0$ and any T, it holds that: $\nabla V(x(t))<0$ or $V(x_{t+1})<V(x_t)$.

Given a learned dynamics model, the Lyapunov function may be learned as well, e.g., using a neural network. However, instead of learning a dynamics model and attempting to separately verify its stability via a (learned) Lyapunov function, the above measures jointly learn a dynamics model and Lyapunov function, where the dynamics is inherently constrained to be stable everywhere in the state space according to the Lyapunov function. Accordingly, the learned dynamics model is stable even for states which are not seen during training. Compared to conventional approaches for learning dynamics models, the above measures provide a learned dynamics model which is inherently globally stable, instead of being merely incentivized during the training to be globally stable, e.g., via a loss function. The above measures provide a learned dynamics model which is highly suitable for real-life applications in which a physical system may assume a state which was unseen during training as the learned dynamics model is inherently guaranteed to be stable.

In some examples, the dynamics model may be integrated into deep architectures, for example an architecture in which a variational auto-encoder transforms observations from sensor data to a latent, physically meaningful low-dimensional space of the system dynamics of the physical system and which may be used as input to the learned dynamics model to obtain a prediction of a future state of the physical system. This prediction may be used in various control or monitoring applications, for example to control a robotic arm to bend a wire, to control an autonomous vehicle to steer and/or brake, etc.

Optionally, the processor subsystem is configured to jointly learn the dynamics model and the Lyapunov function by learning as the dynamics model ($f(x_t)$) a projection (Proj) of nominal dynamics ($\hat{f}(x_t)$) of the physical system, which are learned based on the time-series of states ($x_t$), onto a function that fulfills the Lyapunov condition as defined by the Lyapunov function ($V(x_t)$). Here, the nominal dynamics $\hat{f}(x_t)$ may represent the system dynamics which are learned directly and 'naively' from the training data before projecting, and which may for example be learned by a neural network. During training, the final dynamics $f(x_t)$ may then be evaluated by projection of $\hat{f}(x_t)$ onto the set of dynamics that make $V(x_t)$ a Lyapunov function to ensure global asymptotic stability.

Optionally, the projection (Proj) is an orthogonal projection onto a halfspace. For an arbitrary (e.g., non-stable) nominal dynamics $\hat{f}(x_t)$ and a given positive definite function $V(x) \geq 0$, $V(0)=0$, $V(x)>0$ for $x \neq 0$, global asymptotic stability may be ensured by projecting $\hat{f}$ to $$f(x) = \text{Proj}(\hat{f}(x), \{f : \nabla V(x)^T f \leq \alpha V(x)\}) =$$
$$\hat{f}(x) - \nabla V(x) \frac{\text{ReLU}(\nabla V(x)^T \hat{f}(x) + \alpha V(x))}{\|\nabla V(x)\|_2^2}$$

where Proj(.,.) may denote an orthogonal projection onto a halfspace. For example, automatic differentiation tools may be used to define V, such that including $\nabla V$ in the definition of $f(x_t)$ may be done straightforwardly. Thereby, $f(x_t)$ may be trained straightforwardly, similar to the training of any other dynamics model.

Optionally, the dynamics model ($f(x_t)$) comprises a neural network for learning the nominal dynamics ($\hat{f}(x_t)$) of the physical system based on the time-sequential pairs of states ($x_t$). In addition to the machine learnable Lyapunov function $V(x_t)$, the dynamics model may comprise a neural network for learning the nominal dynamics $\hat{f}(x_t)$. The dynamics model may thus be comprised of two different neural networks.

Optionally, the machine learnable Lyapunov function ($V(x_t)$) is represented at least in part by an input-convex neural network (ICNN, g(x)). The Lyapunov function $V(x_t)$ may also be learned and represented by a neural network. By specifically selecting an input-convex neural network g(x) which enforces the condition that g(x) is convex in its inputs x, it may be ensured that $V(x_t)$ has only one global optimum, which is one of the properties of the Lyapunov function which is to be learned by the input-convex neural network.

Optionally, the input-convex neural network (ICNN, g(x)) comprises a smoothed variant of a rectified linear unit (ReLu) for each of the activation functions. Using a smoothed variant of the ReLu may ensure that $V(x_t)$ is continuously differentiable. For example, a linear ReLu may be modified to provide a quadratic function in [0,d].

Optionally, the Lyapunov function ($V(x_t)$) is shifted to establish a zero value of the Lyapunov function ($V(x_t)=0$) at an equilibrium point ($x_t=0$) of the Lyapunov function, and wherein the learning of the Lyapunov function comprises using a quadratic regularization term to ensure strict positive definitiveness of the Lyapunov function. Positive definitiveness is another property of the Lyapunov function which is to be learned by the input-convex neural network, and which may be ensured by the above measures.

Optionally, the processor subsystem is configured to, when learning the input-convex neural network (ICNN, g(x)) on the training data ($x_t$), apply a continuously differentiable invertible function (F(x)) to the training data ($x_t$) and use an output of the continuously differential invertible function as an input (g(F(x)) to the input-convex neural network. Invertibility may ensure that the sublevel sets of V, which may be by definition convex sets, map to contiguous regions of the composite function g∘F, thus ensuring that no local optima exist in the composed function and thus that V has only one optimum.

Optionally, the output device is an actuator associated with the physical system, and the processor subsystem is configured to control the physical system by providing control data to the actuator which is based on the inferred future state ($x_{t+1}$) of the physical system. For example, the actuator may be used to control a vehicle, such as an autonomous or semi-autonomous vehicle, a robot, a manufacturing machine, a building, etc.

Optionally, the control or monitoring system is one of: a vehicle control system, a robotics control system, a manufacturing control system, a building control system. Such types of control systems greatly benefit from using a dynamics model which has been learned to be globally stable by being jointly learned with a Lyapunov function.

Optionally, the computer-implemented or system for training a machine learnable dynamics model to learn the dynamics of a physical system may further comprise any computer-implemented method or system described in this specification for using the learned dynamics model, for example for control or monitoring of a physical system.

It will be appreciated by those skilled in the art that two or more of the above-mentioned embodiments, implementations, and/or optional aspects of the present invention may be combined in any way deemed useful.

Modifications and variations of any system, any computer-implemented method or any computer-readable medium, which correspond to the described modifications and variations of another one of said entities, can be carried out by a person skilled in the art on the basis of the present description.

BRIEF DESCRIPTION OF THE DRAWINGS

These and other aspects of the present invention will be apparent from and elucidated further with reference to the embodiments described by way of example in the following description and with reference to the figures.

FIGS. 3A-3C each show a contour plot of a Lyapunov function of a stable dynamics system, in which FIG. 3A illustrates the trajectory of the Lyapunov function, FIG. 3B illustrates $\hat{f}(x)$ having a component g(x) not in the half space and which may be subtracted to obtain $f(x)$, and FIG. 3C illustrates $\hat{f}(x)$ being in the half space and returned unchanged.

FIGS. 5A shows a contour plot of the dynamics of a simple damped pendulum as simulated from first principles.

FIG. 5B shows a contour plot of the learned stable dynamics model.

FIG. 5C shows a contour plot of the learned Lyapunov function.

It should be noted that the figures are purely diagrammatic and not drawn to scale. In the figures, elements which correspond to elements already described may have the same reference numerals.

LIST OF REFERENCE NUMBERS

Figure 2:
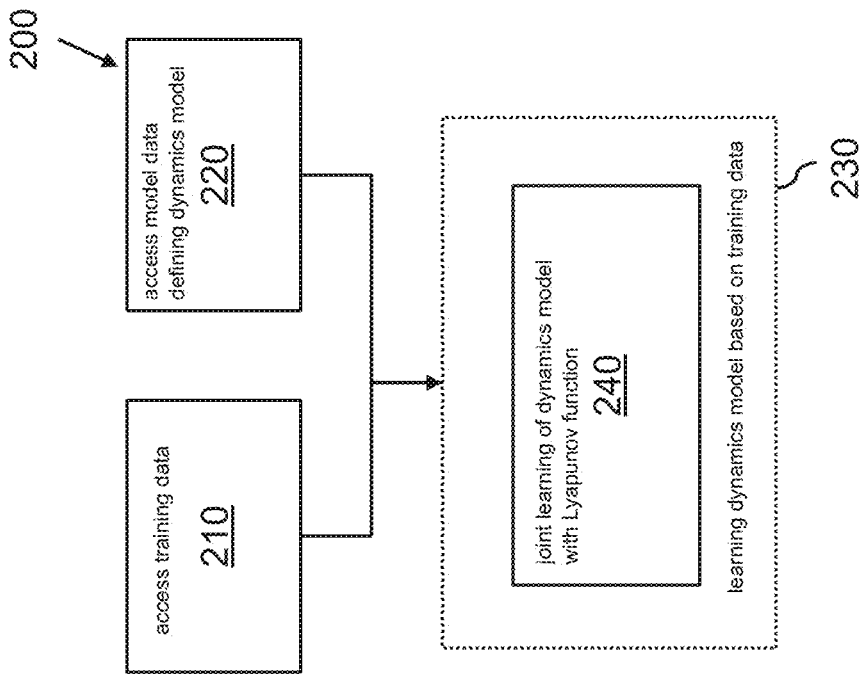
FIG. 2 shows an example computer-implemented method for training the learnable dynamics model to learn the dynamics of the physical system based on the training data, in accordance with an example embodiment of the present invention.

The following list of reference numbers is provided for facilitating understanding of the figures and shall not be construed as limiting the present invention.

20 sensor
22 camera
40 actuator
42 electric motor
60 environment
80 (semi)autonomous vehicle 100 system for training dynamics model
160 processor subsystem
180 data storage interface
190 data storage
192 training data
194 model data
196 model data
200 method for training dynamics model
210 accessing training data
220 accessing model data defining dynamics model
230 learning dynamics model based on training data
240 joint learning of dynamics model with Lyapunov function
300-304 contour plot of Lyapunov function of stable dynamics system
400 rectified linear unit activation function
410 smoothed variant of rectified linear unit activation function
500 streamplot of dynamics as simulated from first principles
510 streamplot of dynamics of the learned dynamics model
520 contour plot of the learned Lyapunov function
600 prediction error as a function of timestamp for 8-link pendulum
610 timestamp
620 prediction error
630 average error over 1000 timestamps as function of number of links
640 number of links
650 average prediction error
660 simple learned dynamics model
670 stable learned dynamics model
700 structure of video texture generation network
710 stable dynamics model run 1
720 stable dynamics model run 2
730 stable dynamics model run 3
740 naïve dynamics model
800 system for control or monitoring using learned dynamics model
820 sensor data interface
822 sensor data
840 actuator interface
842 control data
860 processor subsystem
880 data storage interface
890 data storage
900 method for control or monitoring using learned dynamics model
910 accessing sensor data
920 accessing model data defining learned dynamics model
930 inferring future state from observed current state using model
940 providing output data based on inferred future state
1000 computer-readable medium
1010 non-transitory data

DETAILED DESCRIPTION OF EXAMPLE EMBODIMENTS

Figure 1:
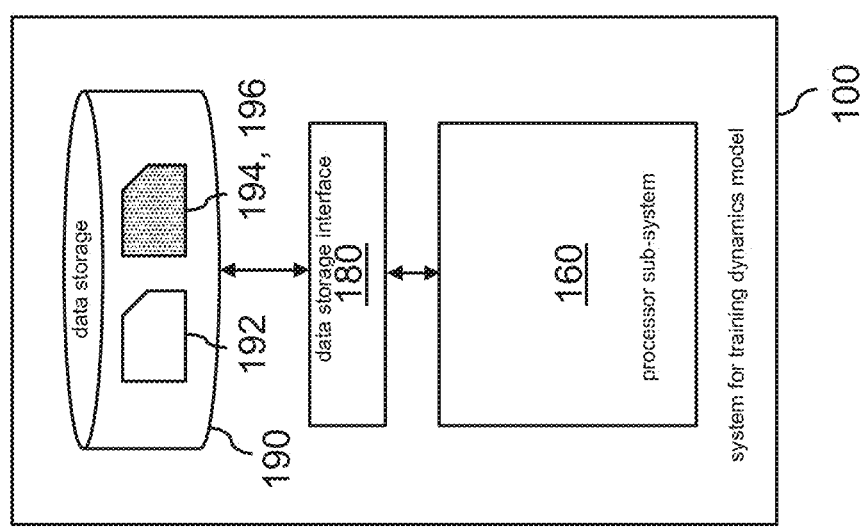
FIG. 1 shows an example system for training a learnable dynamics model to learn dynamics of a physical system based on training data which comprises states of the physical system and/or its environment, wherein the dynamics model comprises a learnable Lyapunov function to establish globally stability of the learned dynamics model, in accordance with an example embodiment of the present invention.
Figures 6A, 6B:
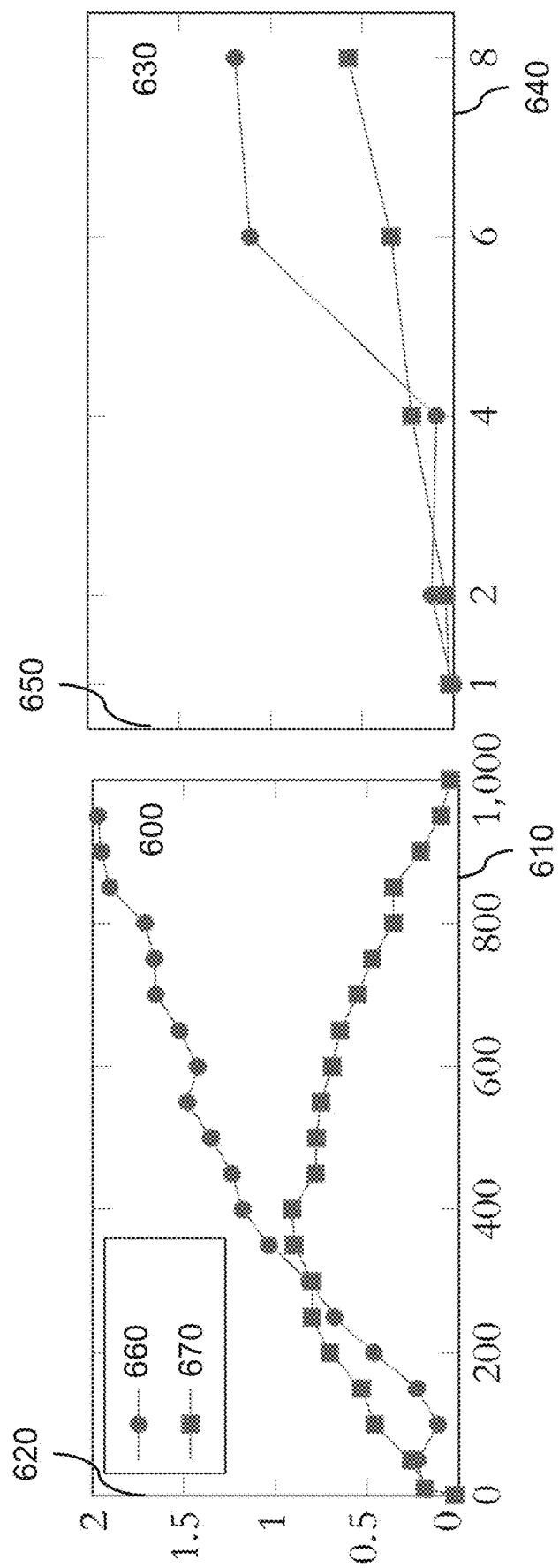
FIG. 6A shows the prediction error of the angular position and angular velocity for an 8-link pendulum as a function of timesteps.
FIG. 6B shows the average prediction error over 1000 timesteps as a function of a number of links of the pendulum.
Figure 7A:
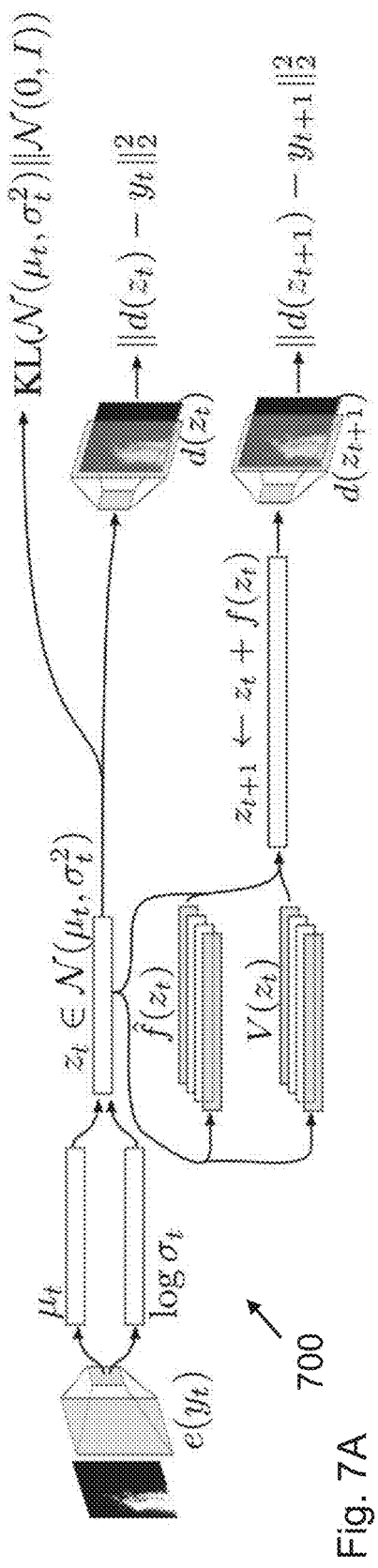
FIG. 7A shows a structure of a video texture generation network in which the encoder e and decoder d form a Variational Autoencoder, and the stable dynamics model f is trained together with the decoder d to predict a next frame in a video texture.
Figure 7B:
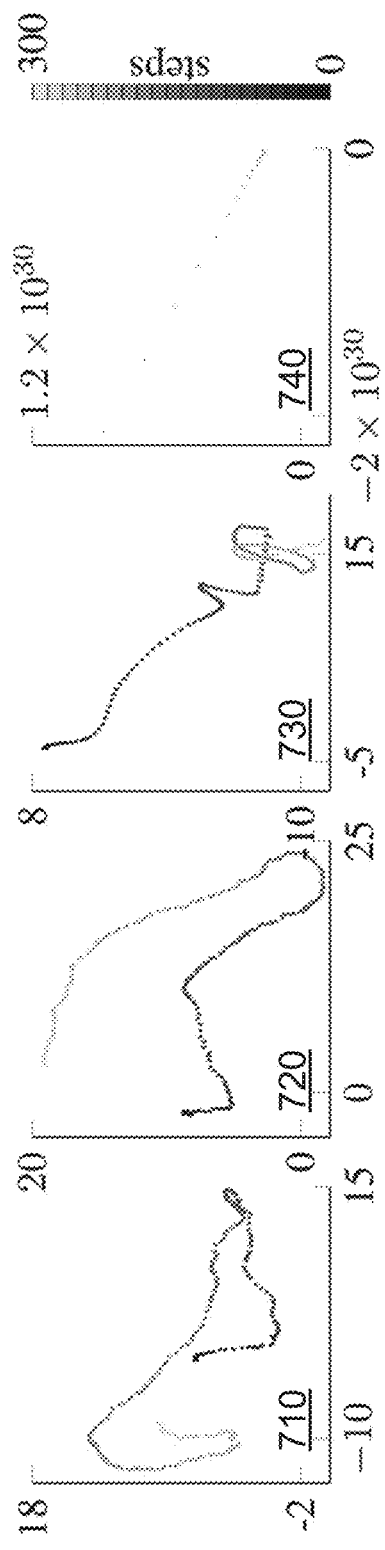
FIG. 7B shows trajectories projected onto a two-dimensional plane for, from left to right, three different runs of the dynamics model with the stability constraint and for a dynamics model without the stability constraint in the form of a generic neural network.
Figure 8:
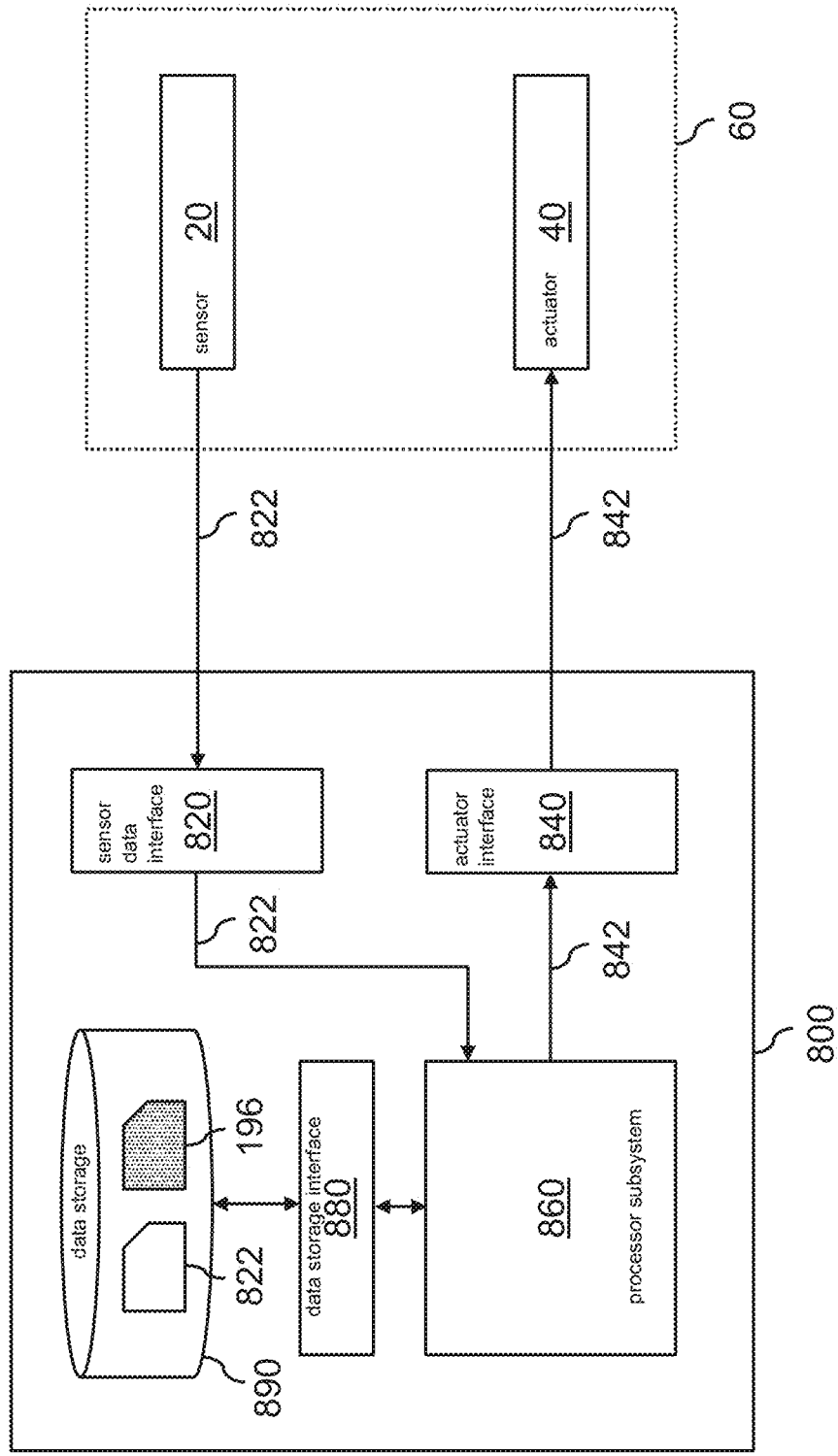
FIG. 8 shows system for control or monitoring using learned dynamics model.
Figure 9:
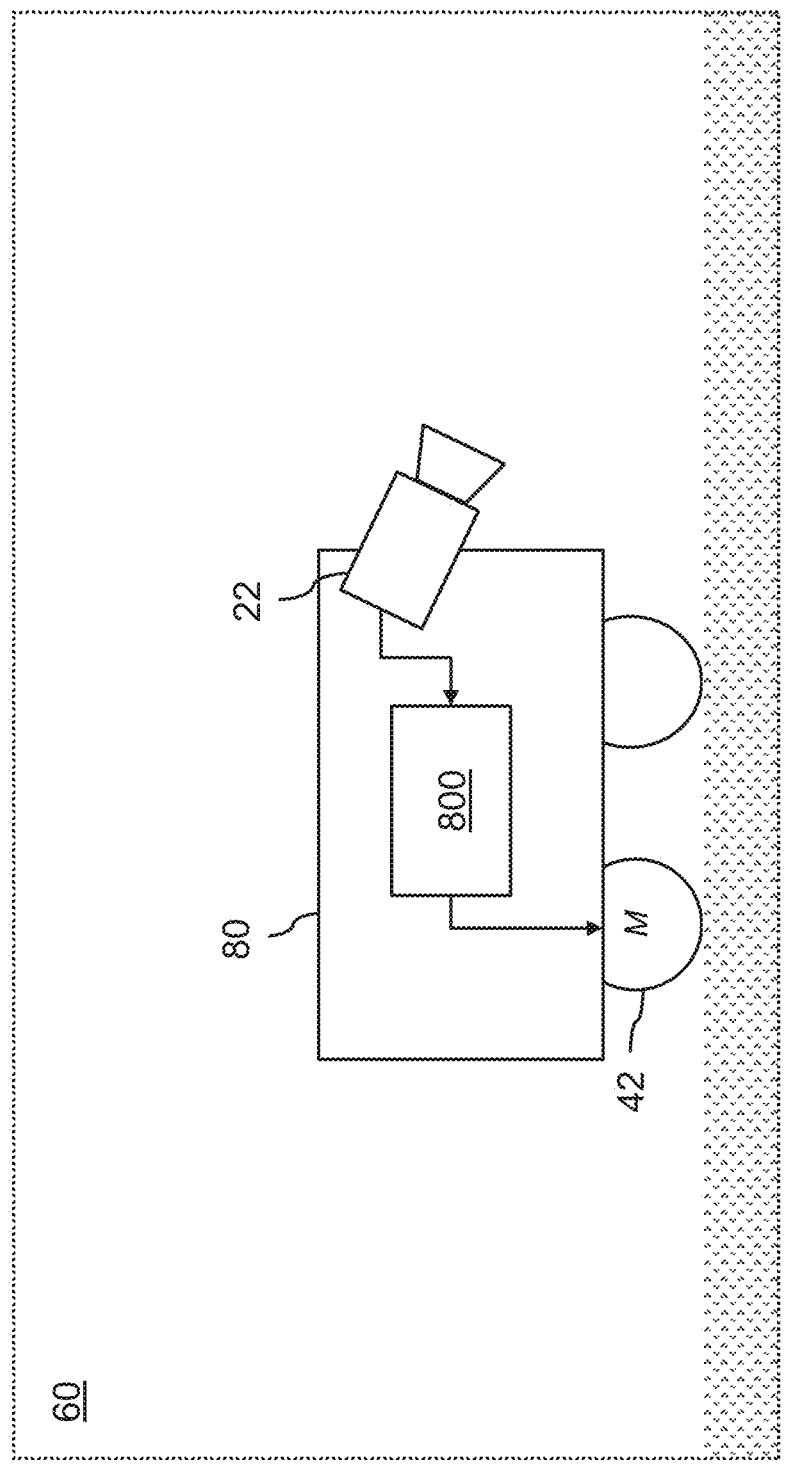
FIG. 9 shows the system as part of an (semi-)autonomous vehicle.
Figures 10, 11:
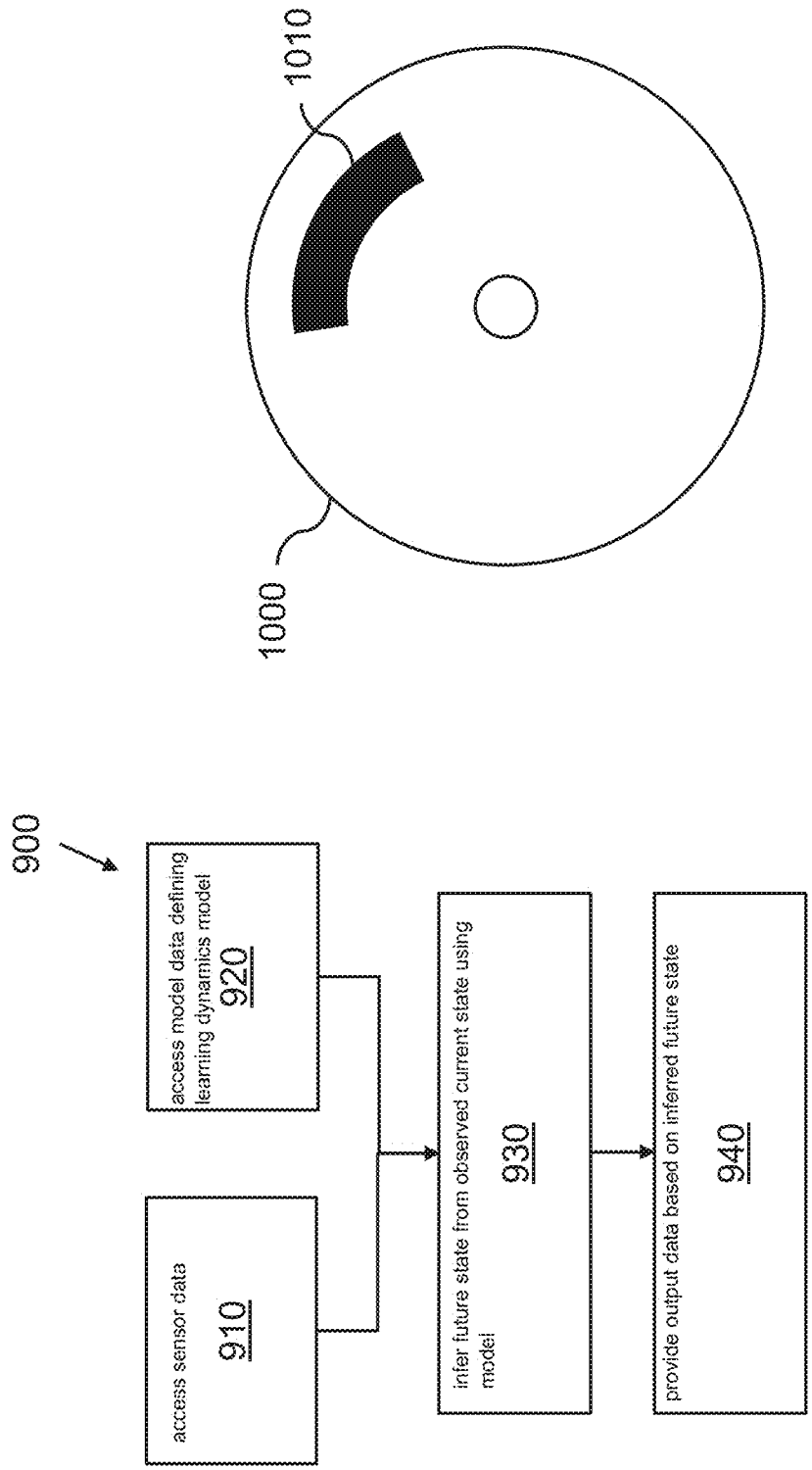
FIG. 10 shows a computer-readable medium comprising data.
FIG. 11 shows an optical disc.

The following describes, with reference to FIGS. 1 and 2, the training of a learnable dynamics model which comprises a learnable Lyapunov function to establish global stability of the learned dynamics model, then describes with reference to FIGS. 3A-5C the dynamics model and its training in more detail, then describes with reference to FIG. 6A-7B applications of the dynamics model which include a comparison to a non-stable dynamics model, and with reference to FIGS. 8-10 the use of the learned dynamics model for the control or monitoring of a physical system, such as an (semi-) autonomous vehicle.

FIG. 1 shows an example system 100 for training, in accordance with the present invention, a dynamics model to learn dynamics of a physical system by learning to infer a future state of the physical system and/or its environment based on a current state of the physical system and/or its environment.

The system 100 may comprise an input interface for accessing training data 192 representing a time-series of states of the physical system and/or its environment and for accessing model data 194 defining a machine learnable dynamics model which comprises a machine learnable Lyapunov function. For example, as also illustrated in FIG. 1, the input interface may be constituted by a data storage interface 180 which may access the training data 192 and the model data 194 from a data storage 190. For example, the data storage interface 180 may be a memory interface or a persistent storage interface, e.g., a hard disk or an SSD interface, but also a personal, local or wide area network interface such as a Bluetooth, Zigbee or Wi-Fi interface or an ethernet or fiberoptic interface. The data storage 190 may be an internal data storage of the system 100, such as a hard drive or SSD, but also an external data storage, e.g., a network-accessible data storage. In some embodiments, the training data 192 and the model data 194 may each be accessed from a different data storage, e.g., via a different subsystem of the data storage interface 180. Each subsystem may be of a type as is described above for the data storage interface 180.

The system 100 may further comprise a processor subsystem 160 which may be configured to, during operation of the system 100, to learn the dynamics model based on time-sequential pairs of states so as to learn to infer a future state of the physical system and/or its environment based on the current state, wherein said learning is constrained to provide a globally stable modelling of the dynamics of the physical system by jointly learning the dynamics model and the Lyapunov function so that values of the learned Lyapunov function decrease along all trajectories of states inferred by the learned dynamics model. This dynamics model and its training will be further described with reference to FIG. 3A-5C.

The system 100 may further comprise an output interface for outputting trained model data 196 representing the learned (or 'trained') dynamics model. For example, as also illustrated in FIG. 1, the output interface may be constituted by the data storage interface 180, with said interface being in these embodiments an input/output ('IO') interface, via which the trained model data 196 may be stored in the data storage 190. For example, the model data 194 defining the 'untrained' dynamics model may during or after the training be replaced, at least in part, by the model data 196 of the trained dynamics model, in that the parameters of the dynamics model, such as weights and other types of parameters of neural networks, may be adapted to reflect the training on the training data 192. This is also illustrated in FIG. 1 by the reference numerals 194, 196 referring to the same data record on the data storage 190. In other embodiments, the trained model data 196 may be stored separately from the model data 194 defining the 'untrained' dynamics model. In some embodiments, the output interface may be separate from the data storage interface 180, but may in general be of a type as described above for the data storage interface 180.

FIG. 2 shows an example computer-implemented method 200 in accordance with the present invention for training a dynamics model to learn dynamics of a physical system by learning infer a future state of the physical system and/or its environment based on a current state of the physical system and/or its environment. The method 200 may correspond to an operation of the system 100 of FIG. 1, but does not need to, in that it may also correspond to an operation of another type of system, apparatus or device or in that it may correspond to a computer program.

The computer-implemented method 200 is shown to comprise, in a step titled "ACCESSING TRAINING DATA", accessing 210 training data representing a time-series of states of the physical system and/or its environment, in a step titled "ACCESSING MODEL DATA DEFINING DYNAMICS MODEL", accessing 220 model data defining a machine learnable dynamics model which comprises a machine learnable Lyapunov function, in a step titled "LEARNING DYNAMICS MODEL BASED ON TRAINING DATA", learning 230 the dynamics model based on time-sequential pairs of states so as to learn to infer a future state of the physical system and/or its environment based on the current state, wherein said learning step 230 comprises, in a step or sub-step titled "JOINT LEARNING OF DYNAMICS MODEL WITH LYAPUNOV FUNCTION", constraining the learning to provide a globally stable modelling of the dynamics of the physical system by jointly learning 240 the dynamics model and the Lyapunov function so that values of the learned Lyapunov function decrease along all trajectories of states inferred by the learned dynamics model.

The following examples describe the machine learnable dynamics model, including the training thereof, in more detail. However, the actual implementation of the machine learnable dynamics model and its training may be carried out in various other ways, e.g., on the basis of analogous mathematical concepts. For example, instead of using a neural network, a Gaussian process or another machine learnable model type may be used to learn the nominal dynamics of the physical system and to learn the Lyapunov function.

Briefly speaking, the following deals with learning continuous time dynamical systems, but also applies mutatis mutandis to discrete time dynamical systems. That is, given a state at time t, $x(t) \in \mathbb{R}^n$, the time-derivative of the state is modelled as $$\dot{x}(t) \equiv \frac{d}{dt}x(t) = f(x(t)) \qquad (1)$$

for some function $f: \mathbb{R}^n \to \mathbb{R}^n$: Modeling the time evolution of such dynamical systems (or their counterparts with control inputs $\dot{x}(t) = f(x(t), u(t))$ for $u(t) \in \mathbb{R}^m$) is a foundational problem, with applications in reinforcement learning, control, forecasting, and many other settings. Owing to their representational power, neural networks have long been a natural choice for modeling the above function. However, when using a generic neural network to model dynamics in this setting, very little can be guaranteed about the behavior of the learned system. For example, it is very difficult to say anything about the stability properties of a learned model (informally, the tendency of the system to remain within some invariant bounded set). While some recent work has begun to consider stability properties of neural networks, see the aforementioned [1, 2, 3], such work has typically done so by ("softly") enforcing stability as an additional loss term on the training data. Consequently, such work can say little about the stability of the system in unseen states.

Herein, an approach is described to learning neural network dynamics that are provably stable over the entirety of the state space. To do so, the system dynamics and a Lyapunov function may be jointly learned. This stability may be a hard constraint imposed upon the model. Accordingly, unlike recent approaches, stability may not be enforced via an imposed loss function but built directly into the dynamics of the model (e.g., even a randomly initialized model in the described model class will be provably stable everywhere in state space). For that purpose, a Lyapunov function may be provided, which may be based on an input convex neural network, and which may ensure global exponential stability to an equilibrium point while still allowing for expressive dynamics.

Using these methods, the following demonstrates learning the dynamics of physical models such as n-link pendulums, e.g., with reference to FIGS. 5A-6B, and shows a substantial improvement over generic networks. It is also shown how such dynamics models can be integrated into larger network systems to learn dynamics over complex output spaces. In particular, it is shown with reference to FIGS. 7A-7B how to combine the model with a variational auto-encoder (VAE) to learn dynamic 'video textures'.

The following primarily considers the setting of autonomous dynamics $\dot{x}(t) = f(x(t))$ for $x(t) \in \mathbb{R}^n$. While the techniques described in this specification are applicable to the dynamics with control as well, the following discussion focuses on the autonomous case for ease of explanation. A system is defined to be globally asymptotically stable (for simplicity, around the equilibrium point $x_e = 0$) if we have $x(0) \to 0$ as $t \to \infty$ for any initial state $x(0) \in \mathbb{R}^n$; $f$ is locally asymptotically stable if the same holds but only for $x(0) \in B$ where B is some bounded set containing the origin. Similarly, $f$ is globally (locally, respectively) exponentially stable (e.g., converges to the equilibrium "exponentially quickly") if $$\|x(t)\|_2 \leq m\|x(0)\|_2 e^{-\alpha t} \qquad (2)$$

for some constants m, $\alpha \geq 0$ for any $x(0) \in \mathbb{R}^n$ (B, respectively).

The area of Lyapunov theory establishes the connection between the various types of stability mentioned above and descent according to a particular type of function known as a Lyapunov function. Specifically, let $V: \mathbb{R}^n \to \mathbb{R}$ be a continuously differentiable positive definite function, i.e., $V(x) > 0$ for $x \neq 0$ and $V(0) = 0$. Lyapunov analysis says that $f$ is stable (according to the definitions above) if and only if we can find some function V as above such the value of this function is decreasing along trajectories generated by $f$. Formally, this is the condition that the time derivative $\dot{V}(x(t)) < 0$, i.e., $$\dot{V}(x(t)) = \frac{d}{dt}V(x(t)) = \nabla V(x)^T \frac{d}{dt}x(t) = \nabla V(x(t))^T f(x(t)) < 0 \qquad (3)$$

This condition should hold for all $x(t) \in \mathbb{R}^n$ or for all $x(t) \in B$ to ensure global or local stability respectively. Similarly, $f$ is globally asymptotically stable if and only if there exists positive definite V such that $$\dot{V}(x(t)) \leq -\alpha V(x(t)), \text{ with } c_1\|x\|_2^2 \leq V(x) \leq c_2\|x\|_2^2 \quad (4)$$

Showing that these conditions imply the various forms of stability is relatively straightforward, but showing the converse (that any stable system must obey this property for some V) is relatively more complex. However, we are largely concerned with the "simpler" of these two directions, as the goal is to enforce conditions that ensure stability.

Briefly speaking, for an arbitrary (non-stable) nominal dynamics $\hat{f}$ and a given positive definite function $V(x) \geq 0$, $V(0)=0$, $V(x)>0$ for $x \neq 0$, we may ensure global asymptotic stability by projecting $\hat{f}$ to $$f(x) = \text{Proj}(\hat{f}(x), \{f: \nabla V(x)^T f \leq \alpha V(x)\}) =$$
$$\hat{f}(x) - \nabla V(x) \frac{\text{ReLU}(\nabla V(x)^T \hat{f}(x) + \alpha V(x))}{\|\nabla V(x)\|_2^2}$$

where Proj(.,.) denotes the orthogonal projection onto a halfspace. For example, automatic differentiation tools may be used to define/implement V such that including $\nabla V$ in the definition of $f$ can be done straightforwardly. Overall, the neural network for 71 may be trained straightforwardly, similar to the training for any other function.

The following provides a more detailed explanation of the above while referring to FIGS. 3A-7B. The intuition of at least some of the techniques described in this specification may be summarized as follows: instead of learning a dynamics function and attempting to separately verify its stability via a Lyapunov function, a dynamics model and Lyapunov function are jointly learned, where the modeling of the dynamics may be inherently constrained to be stable (everywhere in the state space) according to the Lyapunov function. Specifically, following the principles mentioned above, let $\hat{f}:\mathbb{R}^n \to \mathbb{R}^n$ denote a "nominal" dynamics model referring to a dynamics model which is directly learned on the training data, e.g., without incorporating the Lyapunov function, and let $V:\mathbb{R}^n \to \mathbb{R}$ be a positive definite function: $V(x) \geq 0$ for $x \neq 0$ and $V(0)=0$. Then in order to (provably, globally) ensure that a dynamics function is stable, $\hat{f}$ may be projected such that it satisfies the condition $$\nabla V(x)^T \hat{f}(x) \leq -\alpha V(x) \quad (9)$$

i.e., one may define the dynamics as $$f(x) = \text{Proj}(\hat{f}(x), \{f: \nabla V(x)^T f \leq -\alpha V(x)\}) \quad (10)$$
$$= \begin{cases} \hat{f}(x) & \text{if } \nabla V(x)^T \hat{f}(x) \leq -\alpha V(x) \\ \hat{f}(x) - \nabla V(x) \frac{\nabla V(x)^T \hat{f}(x) + \alpha V(x)}{\|\nabla V(x)\|_2^2} & \text{otherwise} \end{cases}$$
$$= \hat{f}(x) - \nabla V(x) \frac{\text{ReLU}(\nabla V(x)^T \hat{f}(x) + \alpha V(x))}{\|\nabla V(x)\|_2^2}$$

where Proj(x;C) may denote the orthogonal projection of x onto the point C, and where the second equation follows from the analytical projection of a point onto a halfspace. V may for example be defined using automatic differentiation tools. Accordingly, the gradient $\nabla V$ term may be included into the definition of $f$, obtaining a composite neural network for $f$ (e.g., comprising a first neural network for $\hat{f}$ and a second neural network for the Lyapunov function) which may be trained just like any other function.

Figure 3C:
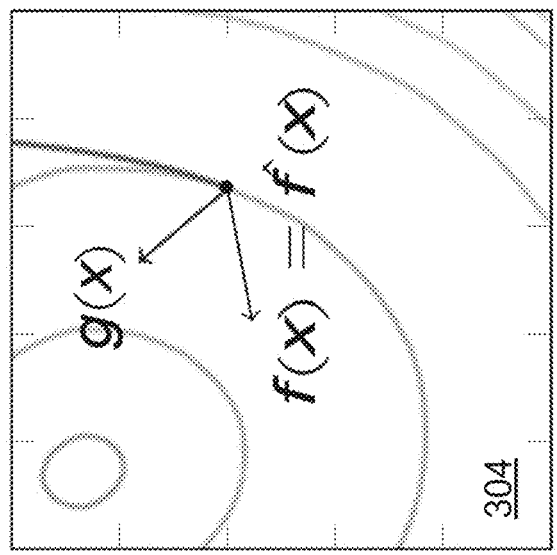
Figure 3B:
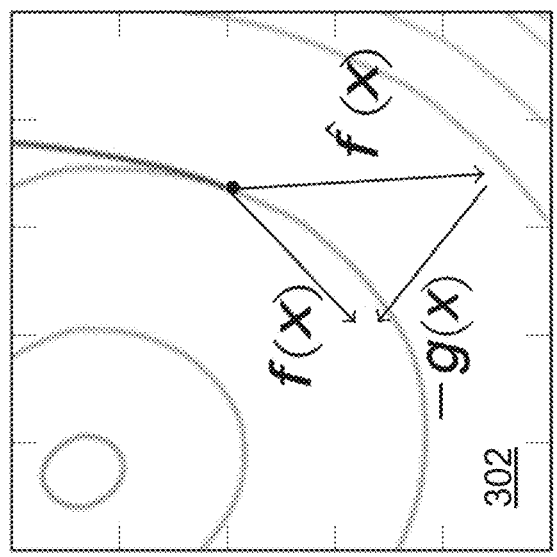
Figure 3A:
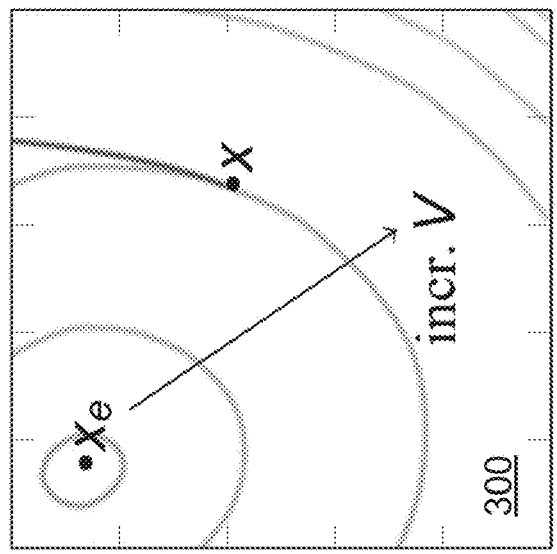

FIGS. 3A-3C provide an illustration of the above. Each of FIGS. 3A-3C shows a contour plot 300-304 of a Lyapunov function of a stable dynamics system, in which FIG. 3A illustrates the trajectory of the Lyapunov function by way of an arrow pointing in a direction of increasing value of the Lyapunov function. Let $$g(x) = \frac{\nabla V(x)}{\|\nabla V(x)\|_2^2} \text{ReLU}(\nabla V(x)^T \hat{f}(x) + \alpha V(x)).$$

FIG. 3B illustrates $\hat{f}(x)$ having a component g(x) not in the half space and which may be subtracted to obtain $f(x)$, and FIG. 3C illustrates $\hat{f}(x)$ being in the half space and returned unchanged.

As indicated previously, V may need to be positive definite, but additionally V may be preferred to have no local optima except 0. This is due to Lyapunov decrease condition: one may desire to guarantee stability to the equilibrium point x=0, yet the decrease condition imposed upon the dynamics may mean that V may be decreasing along trajectories of $f$. If V has a local optimum away from the origin, the dynamics may in theory, but may not need to in practice, get stuck in this location; this may manifest itself by the $\|\nabla V(x)\|_2^2$ term going to zero, which may result in the dynamics becoming undefined at the optima. The above conditions may be enforced by design decisions as described below.

The Lyapunov function V may be learned and represented by a neural network. To ensure the required properties of V, the following considerations may apply. More specifically, one may prefer to ensure (i) that V has only one (global) optimum (without loss of generality assumed to be V(0)=0), (ii) that V is positive definite, e.g., V(x)>0 for $x \neq 0$ and (iii) that V is continuously differentiable.

Firstly, property (i) may be enforced by representing V with an input-convex neural network (ICNN) g, which may be defined by:

$$z_1 = \sigma_0(W_0 x + b_0) \; z_{i+} = \sigma_0(U_i z_i + W_i x + b_i), \; i=1, \ldots k-1 \; g(x) = z_k \quad (11)$$

where $W_i$ may be real-valued weights mapping from inputs to the i+1 layer activations; $U_i$ may be positive weights mapping previously layer activations $z_i$ to the next layer; $b_i$ may be real-valued biases; and $\sigma_i$ may be convex, monotonically non-decreasing non-linear activations, such as the ReLU or smooth variants thereof. With this formulation, g is convex in x, and any convex function can be approximated by such networks.

Secondly, it may be desirable to ensure that V is positive definite. Representing V with an ICNN makes V convex, i.e., there is only one optimum, however it does not enforce V(0)=0. There are multiple ways to ensure V(0)=0. For example, one could find the global optimum of g and shift it or by removing the biases terms. However, shifting requires finding the optimum during training, which may be computationally expensive while removing the biases may put limitations on the class of variables that can be approximated. As an alternative approach, g may be shifted to ensure V(0)=0, while a little quadratic regularization term may be added to ensure positive definiteness, e.g., as:

$$V(x) = \sigma_{k+1}(g(x) - g(0)) + \epsilon \|x\|_2^2 \quad (12)$$

where $\sigma_k$ may be a positive, convex, non-decreasing function with $\sigma_k(0)=0$ and $\epsilon$ is a small constant, for example selected such that $$\varepsilon > \max_x \dot{g}(x)/2.$$

Figure 4B:
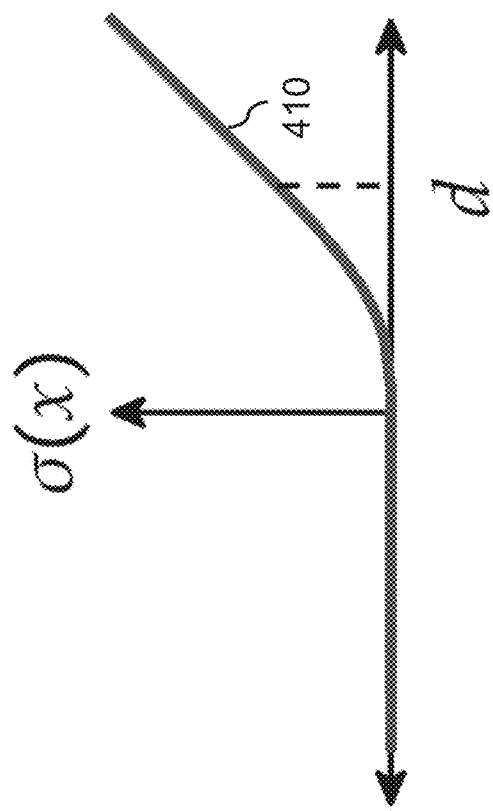
FIG. 4B illustrates a smoothed variant of the rectified linear unit activation function.
Figure 4A:
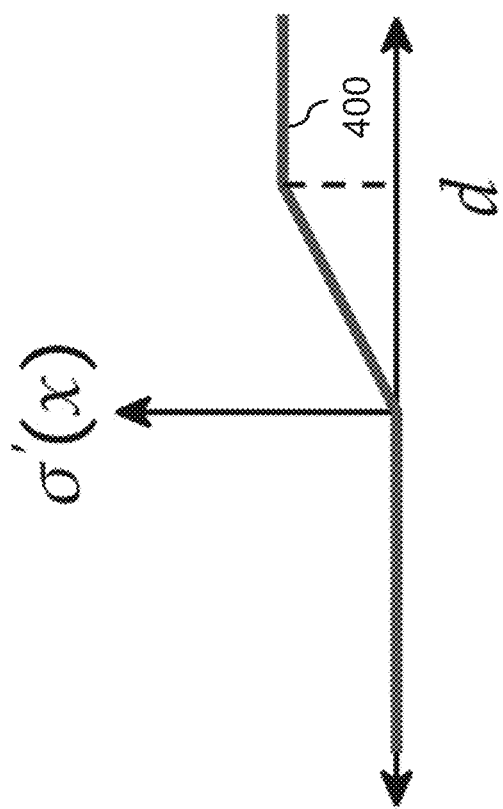
FIG. 4A illustrates a rectified linear unit activation function.

Thirdly, it may be desirable to ensure that V is continuously differentiable, for example by using a smoothed version 410 of the ReLU activations, as shown in FIG. 4B, that replaces the linear ReLU 400, as shown in FIG. 4A, by a quadratic function in [0,d].

$$\sigma(x) = \begin{cases} 0 & \text{if } x \leq 0 \\ x^2 2d & \text{if } 0 < x < d. \\ x - d2 & \text{otherwise} \end{cases} \quad (13)$$

Additionally, warping to the input space may be used, such that the input to g is first mapped by any continuously differentiable, invertible function. Namely, although convexity may ensure that the Lyapunov function have no local optima, this may be a sufficient but not necessary condition, and indeed requiring a strongly convex Lyapunov function may impose too strict a requirement upon the learned dynamics. For this reason, the input to the ICNN function g(x) above may be optionally preceded by any continuously differentiable invertible function $F: \mathbb{R}^n \times \mathbb{R}^n$, e.g., using $$V(x) = \sigma_{k+1}(g(F(x)) - g(F(0))) + \epsilon \|x\|_2^2. \quad (14)$$

as the Lyapunov function. Invertibility may ensure that the sublevel sets of V (which are convex sets, by definition) may map to contiguous regions of the composite function g∘F, thus ensuring that no local optima exist in this composed function.

The above-described dynamics model may be demonstrated on several example problems described with reference to FIGS. 5A-7B. FIGS. 5A-5C relate to the modelling of a physically-based dynamical system, specifically the n-link pendulum. A damped, rigid n-link pendulum's state x may be described by the angular position $\theta_i$ and angular velocity $\dot{\theta}_i$ of each link i. In the following, $\hat{f}$ may be a 2n-100-100-2n fully connected neural network, and V a 2n-60-60-1 ICNN, with properties described previously. The models are trained with pairs of data (x, ẋ) produced by the symbolic algebra solver sympy.

In FIG. 5A, the simulated dynamics for the case of a simple damped pendulum (i.e., with n=1) are shown by a streamplot 500, while FIG. 5B shows a streamplot 510 corresponding to the dynamics learned by the dynamics model and with FIG. 5C showing a contour plot 520 of the learned Lyapunov function. As can be seen, the dynamics may be learned to accurately predict motion of the pendulum even over long time periods.

The learned dynamics may also be evaluated quantitatively while varying n and the time horizon of simulation. FIG. 6A shows a graph 600 showing the prediction error 620 of the angular position θ and angular velocity $\dot{\theta}$ for an 8-link pendulum as a function of timesteps 610, while FIG. 6B shows a graph 630 showing the average prediction error 650 over 1000 timesteps as a function of a number of links 640 of the pendulum. Both graphs 600, 630 show the errors for both a 'simple' prior art model 660 and a learned dynamics model 670 of a type as described in this specification. While both the simple and the stable models show increasing mean error at the start of the trajectory, the dynamics model 670 is able to capture the contraction in the physical system (implied by conservation of energy) and in fact exhibits decreasing error towards the end of the simulation (true and simulated dynamics are both stable). In comparison, the error in the simple model increases.

FIGS. 7A-7B relate to another example in which the dynamics model as described in this specification may be used for stable video texture generation, for example using a Variational Autoencoder (VAE) to learn an encoding for images and the stable dynamics model to learn the dynamics in encoding-space. Given a sequence of frames ($y_0$, $y_1$, ...), the overall network may be fed a frame at time t and may be trained to reconstruct the frames at time t and t+1. Specifically, a VAE may be defined by the encoder e:y→ $\mathbb{R}^{2n}$ giving mean and variance μ, $\log\sigma_t^2 = e(y_t)$, latent state $z_t \in \mathbb{R}^n \sim \mathcal{N}(\mu_t, \theta_t^2)$ and decoder d: $\mathbb{R}^n \to y$, $y_t \approx d(z_t)$. The overall network may be trained to minimize both the standard VAE loss (reconstruction error plus a KL divergence term), but also to minimize the reconstruction loss of a next predicted state. The evolution of the latent dynamics may be modeled at $z_{t+1} \leq \hat{f}(z_t)$, or more precisely $y_{t+1} \leq d(\hat{f}(z_t))$. In other words, as also illustrated in FIG. 7A which shows a structure of the video texture generation network in which the encoder e and decoder d form a Variational Autoencoder and in which the stable dynamics model $\hat{f}$ is trained together with the decoder d to predict a next frame in a video texture, the overall network may be trained minimize:

minimize$_{e,d,\hat{\theta},v} \Sigma_{t=1}^{T-1} (KL(\mathcal{N})(\mu_t, \sigma_t^2 I) \| \mathcal{N}(0, I)) + E_z[\|d(z_t) - y_t\|_2^2 + \|d(\hat{z}_t)) - y_{t+1}\|_2^2])$ The overall network may be trained on pairs of successive frames sampled from videos. To generate video textures, the dynamics model may be seeded with the encoding of a single frame and the dynamics model may be numerically integrated to obtain a trajectory. The VAE decoder may convert each step of the trajectory into a frame.

FIG. 7B shows trajectories projected onto a two-dimensional plane for, from left to right, three different runs of the dynamics model with the stability constraint and for a dynamics model without the stability constraint in the form of a generic neural network. In this example, the true latent space is 320-dimensional, and the trajectories may be projected onto a two-dimensional plane for display. For the non-stable model, the dynamics quickly diverge and produce a static image, whereas for the stable model, it is possible to generate different (stable) trajectories that keep generating realistic images over long time horizons.

FIG. 8 shows a system 800 for controlling or monitoring a physical system using a machine learned modelling of dynamics of the physical system. The system 800 may comprise an input interface 880 for accessing trained model data 196 representing a learned dynamics model as may be generated by the system 100 of FIG. 1 or the method 200 of FIG. 2 or as described elsewhere. For example, as also illustrated in FIG. 8, the input interface may be constituted by a data storage interface 880 which may access the trained model data 196 from a data storage 890. In general, the input interface 880 and the data storage 890 may be of a same type as described with reference to FIG. 1 for the input interface 180 and the data storage 190. FIG. 8 further shows the data storage 892 comprising sensor data 822 representing an observation of a current state of the physical system. As described elsewhere, in some embodiments, the sensor data 822 may also be received directly from a sensor 20 via a sensor interface 820 of via another type of interface instead of being accessed from the data storage 890 via the data storage interface 880.

The system 800 may further comprise a processor subsystem 860 which may be configured to, during operation of the system 800, infer the future state of the physical system based on the observation of the current state of the physical system as obtained from the sensor data 822, and using an output interface as described elsewhere, provide output data 842 to an output device to enable the control or monitoring of the physical system based on the inferred future state, as also described elsewhere in this specification.

It will be appreciated that the same considerations and implementation options apply for the processor subsystem 860 as for the processor subsystem 860 of FIG. 1. It will be further appreciated that the same considerations and implementation options may in general apply to the system 800 as for the system 100 of FIG. 1, unless otherwise noted.

FIG. 8 further shows various optional components of the system 800. For example, in some embodiments, the system 800 may comprise a sensor data interface 820 for directly accessing sensor data 822 acquired by a sensor 20 in an environment 60. The sensor 20 may but does not need to be part of the system 800. The sensor 20 may have any suitable form, such as an image sensor, a lidar sensor, a radar sensor, a pressure sensor, a contain temperature sensor, etc. In some embodiments, the sensor data 822 may sensor measurements of different physical quantities in that it may be obtained from two or more different sensors sensing different physical quantities. The sensor data interface 820 may have any suitable form corresponding in type to the type of sensor, including but not limited to a low-level communication interface, e.g., based on I2C or SPI data communication, or a data storage interface of a type as described above for the data storage interface 880.

In some embodiments, the system 800 may comprise an actuator interface 840 for providing control data 842 to an actuator 40 in the environment 60. Such control data 842 may be generated by the processor subsystem 860 to control the actuator 40 based on one or more inferred future states of the physical system, which may be generated using the learned dynamics model. For example, the actuator may be an electric, hydraulic, pneumatic, thermal, magnetic and/or mechanical actuator. Specific yet non-limiting examples include electrical motors, electroactive polymers, hydraulic cylinders, piezoelectric actuators, pneumatic actuators, servomechanisms, solenoids, stepper motors, etc. Such type of control is described with reference to FIG. 9 for an (semi-) autonomous vehicle.

In other embodiments (not shown in FIG. 8), the system 800 may comprise an output interface to a rendering device, such as a display, a light source, a loudspeaker, a vibration motor, etc., which may be used to generate a sensory perceptible output signal which may be generated based on one or more inferred future states of the physical system. The sensory perceptible output signal may be directly indicative of the inferred future states of the physical system, but may also represent a derived sensory perceptible output signal, e.g., for use in guidance, navigation or other type of control of the physical system.

In general, each system described in this specification, including but not limited to the system 100 of FIG. 1 and the system 800 of FIG. 8, may be embodied as, or in, a single device or apparatus, such as a workstation or a server. The device may be an embedded device. The device or apparatus may comprise one or more microprocessors which execute appropriate software. For example, the processor subsystem of the respective system may be embodied by a single Central Processing Unit (CPU), but also by a combination or system of such CPUs and/or other types of processing units. The software may have been downloaded and/or stored in a corresponding memory, e.g., a volatile memory such as RAM or a non-volatile memory such as Flash. Alternatively, the processor subsystem of the respective system may be implemented in the device or apparatus in the form of programmable logic, e.g., as a Field-Programmable Gate Array (FPGA). In general, each functional unit of the respective system may be implemented in the form of a circuit. The respective system may also be implemented in a distributed manner, e.g., involving different devices or apparatuses, such as distributed local or cloud-based servers. In some embodiments, the system 800 may be part of vehicle, robot or similar physical entity, and/or may be represent a control system configured to control the physical entity.

FIG. 9 shows an example of the above, in that the system 800 is shown to be a control system of an (semi-)autonomous vehicle 80 operating in an environment 60. The autonomous vehicle 80 may be autonomous in that it may comprise an autonomous driving system or a driving assistant system, with the latter also being referred to as a semiautonomous system. The autonomous vehicle 80 may for example incorporate the system 800 to control the steering and the braking of the autonomous vehicle based on sensor data obtained from a video camera 22 integrated into the vehicle 80. For example, the system 800 may control an electric motor 42 to perform (regenerative) braking in case the autonomous vehicle 80 is expected to collide with a traffic participant. The system 800 may control the steering and/or braking to avoid collision with the traffic participant. For that purpose, the system 800 may infer a future state of the vehicle with respect its environment, including the traffic participant, based on the sensor data obtained from the video camera. If the future state of the vehicle, e.g., its future position relative to the traffic participant, is expected to result in a collision, the system 800 may take corresponding action.

FIG. 10 shows a computer-implemented method 900 for controlling or monitoring a physical system using a machine learned modelling of dynamics of the physical system. The method 900 may correspond to an operation of the system 800 of FIG. 8, but may alternatively also be performed using or by any other system, apparatus or device.

The example method 900 is shown to comprise, in a step titled "ACCESSING SENSOR DATA", accessing 910 sensor data representing an observation of a current state of the physical system, in a step titled "ACCESSING MODEL DATA DEFINING LEARNED DYNAMICS MODEL", accessing 920 model data defining a machine learned dynamics model as described elsewhere in this specification, e.g., as obtained from the system 100 or method 200 of FIGS. 1-2, in a step titled "INFERRING FUTURE STATE FROM OBSERVED CURRENT STATE USING MODEL", inferring 930 the future state of the physical system based on the observation of the current state of the physical system as obtained from the sensor data, and in a step titled "PROVIDING OUTPUT DATA BASED ON INFERRED FUTURE STATE", using an output interface to an output device which is used in the control or monitoring of the physical system, providing 940 output data to the output device to enable the control or monitoring of the physical system based on said inferred future state.

It will be appreciated that, in general, the operations or steps of the computer-implemented methods 200 and 800 of respectively FIGS. 2 and 10 may be performed in any suitable order, e.g., consecutively, simultaneously, or a combination thereof, subject to, where applicable, a particular order being necessitated, e.g., by input/output relations.

Each method, algorithm or pseudo-code described in this specification may be implemented on a computer as a computer implemented method, as dedicated hardware, or as a combination of both. As also illustrated in FIG. 11, instructions for the computer, e.g., executable code, may be stored on a computer readable medium 1000, e.g., in the form of a series 1010 of machine-readable physical marks and/or as a series of elements having different electrical, e.g., magnetic, or optical properties or values. The executable code may be stored in a transitory or non-transitory manner. Examples of computer readable mediums include memory devices, optical storage devices, integrated circuits, servers, online software, etc. FIG. 11 shows an optical disc 1010. In an alternative embodiment, the computer readable medium 1000 may comprise trained model data 1010 defining a machine learned dynamics model as described elsewhere in this specification.

Examples, embodiments or optional features, whether indicated as non-limiting or not, are not to be understood as limiting the present invention.

In accordance with an abstract of the specification, a system and computer-implemented method are provided for training a dynamics model to learn the dynamics of a physical system. In particular, the dynamics model may be learned to be able to infer a future state of the physical system and/or its environment based on a current state of the physical system and/or its environment. The learned dynamics model is inherently globally stable. Namely, instead of learning a dynamics model and attempting to separately verify its stability, the learnable dynamics model comprises a learnable Lyapunov function which is jointly learned together with the nominal dynamics of the physical system. Accordingly, the learned dynamics model is highly suitable for real-life applications in which a physical system may assume a state which was unseen during training as the learned dynamics model is inherently globally stable.

It should be noted that the above-mentioned embodiments illustrate rather than limit the present invention, and that those skilled in the art will be able to design many alternative embodiments without departing from the scope of the present invention. Herein, use of the verb "comprise" and its conjugations does not exclude the presence of elements or stages other than those stated. The article "a" or "an" preceding an element does not exclude the presence of a plurality of such elements. Expressions such as "at least one of" when preceding a list or group of elements represent a selection of all or of any subset of elements from the list or group. For example, the expression, "at least one of A, B, and C" should be understood as including only A, only B, only C, both A and B, both A and C, both B and C, or all of A, B, and C. The present invention may be implemented using hardware comprising several distinct elements, and using a suitably programmed computer. In the case of the device being described as several elements, several of these elements may be embodied by one and the same item of hardware. The mere fact that certain measures are described separately does not indicate that a combination of these measures cannot be used to advantage.

What is claimed is:

1. A machine learning system for training a dynamics model to learn dynamics of a physical system by learning to infer a future state of the physical system and/or its environment based on a current state of the physical system and/or its environment, the machine learning system comprising:
    an input interface configured for accessing:
        training data representing a time-series of states of the physical system and/or its environment; and
        model data defining a machine learnable dynamics model which includes a machine learnable Lyapunov function; and
    a processor subsystem configured to learn the dynamics model based on time- sequential pairs of states so as to learn to infer a future state of the physical system and/or its environment based on the current state, wherein the learning is constrained to provide a globally stable modelling of dynamics of the physical system by jointly learning the dynamics model and the Lyapunov function so that values of the learned Lyapunov function decrease along all trajectories of states inferred by the learned dynamics model;
    wherein the processor subsystem is configured to jointly learn the dynamics model and the Lyapunov function by learning, as the dynamics model, a projection of nominal dynamics of the physical system, which are learned based on the time-series of states, onto a function that fulfills a Lyapunov condition as defined by the Lyapunov function; and
    wherein the projection is an orthogonal projection onto a halfspace.

2. The machine learning system according to claim 1, wherein the dynamics model includes a neural network for learning the nominal dynamics of the physical system based on the time-sequential pairs of states.

3. A machine learning system for training a dynamics model to learn dynamics of a physical system by learning to infer a future state of the physical system and/or its environment based on a current state of the physical system and/or its environment, the machine learning system comprising:
    an input interface configured for accessing:
        training data representing a time-series of states of the physical system and/or its environment; and
        model data defining a machine learnable dynamics model which includes a machine learnable Lyapunov function; and
    a processor subsystem configured to learn the dynamics model based on time-sequential pairs of states so as to learn to infer a future state of the physical system and/or its environment based on the current state, wherein the learning is constrained to provide a globally stable modelling of dynamics of the physical system by jointly learning the dynamics model and the Lyapunov function so that values of the learned Lyapunov function decrease along all trajectories of states inferred by the learned dynamics model;
    wherein the machine learnable Lyapunov function is represented at least in part by an input-convex neural network.

4. The machine learning system according to claim 3, wherein the input-convex neural network includes a smoothed variant of a rectified linear unit for each activation function.

5. The machine learning system according to claim 3, wherein the Lyapunov function is shifted to establish a zero value of the Lyapunov function at an equilibrium point of the Lyapunov function, and wherein the learning of the Lyapunov function includes using a quadratic regularization term to ensure strict positive definitiveness of the Lyapunov function.

6. The machine learning system according to claim 3, wherein the processor subsystem is configured to, when learning the input-convex neural network on the training data, apply a continuously differentiable invertible function to the training data and use an output of the continuously differential invertible function as an input to the input-convex neural network.

7. A non-transitory computer-readable medium on which is stored model data defining a machine learnable dynamics model which includes a machine learnable Lyapunov function, wherein the dynamics model is learned to infer a future state of the physical system and/or its environment based on a current state, wherein the learning of the dynamics model has been constrained to provide a globally stable modelling of dynamics of the physical system by the dynamics model and the Lyapunov function having been jointly learned so that values of the learned Lyapunov function decrease along all trajectories of states inferred by the learned dynamics model, wherein the machine learnable Lyapunov function is represented at least in part by an input-convex neural network.

8. A computer-implemented method for training a dynamics model to learn dynamics of a physical system by learning to infer a future state of the physical system and/or its environment based on a current state of the physical system and/or its environment, the method comprising the following steps:
accessing training data representing a time-series of states of the physical system and/or its environment, and model data defining a machine learnable dynamics model which includes a machine learnable Lyapunov function;
learning the dynamics model based on time-sequential pairs of states so as to learn to infer a future state of the physical system and/or its environment based on the current state, wherein the learning includes:
constraining the learning to provide a globally stable modelling of the dynamics of the physical system by jointly learning the dynamics model and the Lyapunov function so that values of the learned Lyapunov function decrease along all trajectories of states inferred by the learned dynamics model;
wherein the machine learnable Lyapunov function is represented at least in part by an input-convex neural network.

9. A computer-implemented method for controlling or monitoring a physical system using a machine learned modelling of dynamics of the physical system, the method comprising the following steps:
accessing:
sensor data representing an observation of a current state of the physical system; and
model data defining a machine learned dynamics model which includes a machine learnable Lyapunov function, wherein the dynamics model is learned to infer a future state of the physical system and/or its environment based on the current state, wherein the learning of the dynamics model has been constrained to provide a globally stable modelling of the dynamics of the physical system by the dynamics model and the Lyapunov function having been jointly learned so that values of the learned Lyapunov function decrease along all trajectories of states inferred by the learned dynamics model;
inferring the future state of the physical system based on the observation of the current state of the physical system as obtained from the sensor data; and
using an output interface to an output device which is used in the control or monitoring of the physical system, to provide output data to the output device to enable the control or monitoring of the physical system based on the inferred future state,
wherein the machine learnable Lyapunov function is represented at least in part by an input-convex neural network.

10. A non-transitory computer-readable medium on which is stored data representing instructions for training a dynamics model to learn dynamics of a physical system by learning to infer a future state of the physical system and/or its environment based on a current state of the physical system and/or its environment, the instructions, when executed by a processor system, causing the processor system to perform the following steps:
accessing training data representing a time-series of states of the physical system and/or its environment, and model data defining a machine learnable dynamics model which includes a machine learnable Lyapunov function;
learning the dynamics model based on time-sequential pairs of states so as to learn to infer a future state of the physical system and/or its environment based on the current state, wherein the learning includes:
constraining the learning to provide a globally stable modelling of the dynamics of the physical system by jointly learning the dynamics model and the Lyapunov function so that values of the learned Lyapunov function decrease along all trajectories of states inferred by the learned dynamics model;
wherein the machine learnable Lyapunov function is represented at least in part by an input-convex neural network.

11. A control or monitoring system for controlling or monitoring a physical system using a machine learned modelling of dynamics of the physical system, the control or monitoring system comprising:
an input interface for accessing:
sensor data representing an observation of a current state of the physical system; and
model data defining a machine learned dynamics model which includes a machine learnable Lyapunov function, wherein the dynamics model is learned to infer a future state of the physical system and/or its environment based on the current state, wherein the learning of the dynamics model has been constrained to provide a globally stable modelling of dynamics of the physical system by the dynamics model and the Lyapunov function having been jointly learned so that values of the learned Lyapunov function decrease along all trajectories of states inferred by the learned dynamics model;
an output interface to an output device which is used in the control or monitoring of the physical system; and
a processor subsystem configured to:

infer the future state of the physical system based on the observation of the current state of the physical system as obtained from the sensor data; and using the output interface, provide output data to the output device to enable the control or monitoring of the physical system based on the inferred future state;

wherein the machine learnable Lyapunov function is represented at least in part by an input-convex neural network.

12. The control or monitoring system according to claim 11, wherein the output device is an actuator associated with the physical system, and wherein the processor subsystem is configured to control the physical system by providing control data to the actuator which is based on the inferred future state of the physical system.

13. The control or monitoring system according to claim 12, wherein the system is one of: a vehicle control system, a robotics control system, a manufacturing control system, and a building control system.

* * * * *